(12) United States Patent
White et al.

(10) Patent No.: US 6,475,825 B2
(45) Date of Patent: Nov. 5, 2002

(54) PROCESS FOR PREPARING ZINC OXIDE FILMS CONTAINING P-TYPE DOPANT

(75) Inventors: Henry W. White, Columbia, MO (US); Shen Zhu, Huntsville, AL (US); Yungryel Ryu, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 09/843,205

(22) Filed: Apr. 26, 2001

(65) Prior Publication Data
US 2002/0031680 A1 Mar. 14, 2002

Related U.S. Application Data

(62) Division of application No. 09/128,516, filed on Aug. 3, 1998, now Pat. No. 6,291,085.
(51) Int. Cl.[7] .................. H01L 21/04; H01L 21/205; H01L 21/225
(52) U.S. Cl. .................. 438/104; 438/505; 250/492.2
(58) Field of Search .................. 438/4, 46, 104, 438/478, 503, 505, 507, 508, 509; 250/492.1, 492.2

(56) References Cited

U.S. PATENT DOCUMENTS

| | | |
|---|---|---|
| 3,713,822 A | 1/1973 | Kiess |
| 3,728,784 A | 4/1973 | Schmidt |
| 3,728,785 A | 4/1973 | Schmidt |
| 3,801,384 A | 4/1974 | Schmidt |
| 4,626,322 A | 12/1986 | Switzer |
| 5,141,564 A | 8/1992 | Chen et al. |
| 5,248,631 A | 9/1993 | Park et al. |
| 5,274,251 A | 12/1993 | Ota et al. |
| 5,574,296 A | 11/1996 | Park et al. |
| 5,620,557 A | 4/1997 | Manabe et al. |
| 5,679,965 A | 10/1997 | Schetzina |
| 5,689,123 A | 11/1997 | Major et al. |
| 5,846,844 A | 12/1998 | Akasaki et al. |

FOREIGN PATENT DOCUMENTS

| | | |
|---|---|---|
| EP | 0 863 555 A2 | 9/1998 |
| WO | WO 00/08691 | 2/2000 |

OTHER PUBLICATIONS

Bagnall et al., Optically pumped lasing of ZnO at room temperature, *Appl. Phys. Lett.*, Apr. 1997, pp. 2230–2232, vol. 70, No. 17.

Craciun et al., Growth of ZnO thin films on GaAs by pulsed laser deposition, *Thin Solid Films*, 1995, pp. 1–4.

Gunshor et al., Blue–green laser–diode technology moves ahead, *Laser Focus World*, Mar. 1995, pp. 97–100.

Hiramatsu et al., Transparent conducting ZnO thin films prepared by XeCl excimer laser ablation, *J. Vac. Sci. Technol.*, Mar./Apr. 1998, pp. 669–673, vol. 16, No. 2.

Minegishi et al., Growth of p–type Zinc Oxide Films by Chemical Vapor Deposition, *J. Appl. Phys.*, 1997, pp. 1453–1455, vol. 36, Pt. 2, No. 11A.

Mohammad et al., Reactive Molecular–Beam Epitaxy for Wurzite GaN, *MRS Bulletin*, Feb. 1997, pp. 22–28.

Nakamura, Blue–Green Light Emitting Diodes and Violet Laser Diodes, *MRS Bulletin*, Feb. 1997, pp. 29–35.

Ohtomo et al., $Mg_xZn_{1-x}$ as a II–VI widegap semiconductor alloy, *Appl. Phy. Lett.*, May 1998, pp. 2466–2468, vol. 72, No. 19.

Pearton et al., GaN and Related Materials for Device Applications, *MRS Bulletin*, Feb. 1997, pp. 17–21.

Ponce, Defects and Interfaces in GaN Epitaxy, *MRS Bulletin*, Feb. 1997, pp. 51–57.

Reynolds et al., Similarities In The Bandedge And Deep––Centre Photoluminescence Mechanisms of ZnO and GaN, *Solid State Comm.*, 1997, pp. 643–646, vol. 101, No. 9.

Shur et al., GaN/AlGaN Heterostructure Devices: Photodetectors and Field–Effect Transistors, *MRS Bulletin*, Feb. 1997, pp. 44–50.

Zolper et al., Implantation and Dry Etching of Group–III–Nitride Semiconductors, *MRS Bulletin*. Feb. 1997, pp. 36–43.

PCT/US 99/17486, International Search Report.

Joseph et al., p–Type Electrical Conduction in ZnO Thin Films by Ga and N Codoping, *Jpn. J. Appl. Phys.*, Nov., 1999, pp. L1205–L1207, vol. 38, Part 2, No. 11A, Japanese Journal of Applied Sciences.

International Search Report, PCT/US00/41952.

*Primary Examiner*—Michael Sherry
*Assistant Examiner*—Evan Pert
(74) *Attorney, Agent, or Firm*—Senniger, Powers, Leavitt & Roedel

(57) ABSTRACT

A p-type zinc oxide film and a process for preparing the film is disclosed. In a preferred embodiment, the p-type zinc oxide film contains arsenic and is grown on a gallium arsenide substrate. The p-type zinc oxide film has a net acceptor concentration of at least about $10^{15}$ acceptors/cm$^3$, a resistivity of no greater than about 1 ohm-cm, and a Hall mobility of between about 0.1 and about 50 cm$^2$/Vs.

24 Claims, 4 Drawing Sheets

FIG. 2  PL: ZnO VS p-ZnO:As AT 20 K 0.5 μm 0.5 μm

PROCESS FOR PREPARING ZINC OXIDE FILMS CONTAINING P-TYPE DOPANT

CROSS-REFERENCE TO RELATED APPLICATIONS

This application is a divisional of application Ser. No. 09/128,516, filed Aug. 3, 1998 now U.S. Pat. No. 6,291,085.

This invention was made with Government support under Grant/Project Number DAAH04-94-G-0305 awarded by the Army Research Office. The Government may have certain rights in the invention.

BACKGROUND OF THE INVENTION

This invention is directed to zinc oxide (ZnO) films for use in electrically excited devices such as light emitting devices (LEDs), laser diodes (LDs), field effect transistors (FETs), and photodetectors. More particularly, this invention is directed to ZnO films containing a p-type dopant for use in LEDs, LDs, FETS, and photodetectors wherein both n-type and p-type materials are required, for use as a substrate material for lattice matching to other materials in such devices, and for use as a layer for attaching electrical leads.

For some time there has been interest in producing II–VI compound wide band gap semiconductors to produce green/blue LEDs, LDs and other electrical devices. Historically, attempts to produce these devices have centered around zinc selenide (ZnSe) or gallium nitride (GaN) based technologies. However, these approaches have not been entirely satisfactory due to the short lifetime of light emission that results from defects, and defect migration, in these devices.

Recently, because ZnO has a wide direct bandgap of 3.3 eV at room temperature and provides a strong emission source of ultraviolet light, ZnO thin films on suitable supporting substrates have been proposed as new materials for light emitting devices and laser diodes. Undoped, as well as doped ZnO films generally show n-type conduction. Impurities such as aluminum and gallium in ZnO films have been studied by Hiramatsu et al. who report activity as n-type donors (*Transparent Conduction Zinc Oxide Thin Films Prepared by XeCl Excimer Laser Ablation*, J. vac. Sci. Technol. A 16(2), March/April 1998). Although n-type ZnO films have been available for some time, the growth of p-type ZnO films necessary to build many electrical devices requiring p-n junctions has to date been much slower in developing.

Minegishi et al. (*Growth of P-Type ZnO Films by Chemical Vapor Deposition*, Jpn. J. Appl. Phys. Vol. 36 Pt. 2, No. 11A (1997)) recently reported on the growth of nitrogen doped ZnO films by chemical vapor deposition and on the p-type conduction of ZnO films at room temperature. Minegishi et al. disclose the growth of p-type ZnO films on a sapphire substrate by the simultaneous addition of $NH_3$ in carrier hydrogen and excess Zn in source ZnO powder. When a Zn/ZnO ratio of 10 mol% was used, secondary ion mass spectrometry (SIMS) confirmed the incorporation of nitrogen into the ZnO film, although the nitrogen concentration was not precisely confirmed. Although the films prepared by Minegishi et al. using a Zn/ZnO ratio of 10 mol% appear to incorporate a small amount of nitrogen into the ZnO film and convert the conduction to p-type, the resistivity of these films is too high for application in devices such as LEDs or LDs. Also, Minegishi et al. report that the carrier density for the holes is $1.5 \times 10^{16}$ holes/$cm^3$, which is considered to be too low for use in commercial light emitting devices or laser diodes.

Park et al. in U.S. Pat. No. 5,574,296 disclose a method of producing thin films on substrates by doping IIB–VIA semiconductors with group VA free radicals for use in electromagnetic radiation transducers. Specifically, Park et al. describe ZnSe epitaxial thin films doped with nitrogen or oxygen wherein ZnSe thin layers are grown on a GaAs substrate by molecular beam epitaxy. The doping of nitrogen or oxygen is accomplished through the use of free radical source which is incorporated into the molecular beam epitaxy system. Using nitrogen as the p-type dopant, net acceptor densities up to $4.9 \times 10^{17}$ acceptors/$cm^3$ and resistivities less than 15 ohm-cm were measured in the ZeSe film. However, the net acceptor density is too low and the resistivity is too high for use in commercial devices such as LEDs, LDs, and FETs.

Although some progress has recently been made in the fabrication of p-type doped ZnO films which can be utilized in the formation of p-n junctions, a need still exists in the industry for ZnO films which contain higher net acceptor concentrations and possess lower resistivity values.

SUMMARY OF THE INVENTION

Among the objects of the present invention, therefore, are the provision of a ZnO film containing a high net acceptor concentration on a substrate; the provision of a process for producing ZnO films containing p-type dopants; the provision of a process for producing p-n junctions utilizing a ZnO film containing a p-type dopant; the provision of a process for producing homoepitaxial and heteroepitaxial p-n junctions utilizing a ZnO film containing a p-type dopant; and the provision of a process for cleaning a substrate prior to growing a film on the substrate.

Briefly, therefore, the present invention is directed to a ZnO film on a substrate wherein the film contains a p-type dopant. The film has a net acceptor concentration of at least about $10^{15}$ acceptors/$cm^3$, a resistivity less than about 1 ohm-cm, and a Hall Mobility of between about 0.1 and about 50 $cm^2$/Vs.

The invention is further directed to a process for growing a p-type ZnO film containing arsenic on a GaAs substrate. The GaAs substrate is first cleaned to ensure that the film will have a reduced number of defects and will properly adhere to the substrate. After cleaning the temperature in the chamber is adjusted to between about 300° C. and about 450° C. and the excimer pulsed laser is directed onto a polycrystalline ZnO crystal to grow a film on the substrate. The temperature of the deposition chamber containing the substrate coated with the film is then increased to between about 450° C. and about 600° C. and the substrate is annealed for a time sufficient to diffuse arsenic atoms into the film so as to produce a net acceptor concentration of at least about $10^{18}$ acceptors/$cm^3$ in the film.

The invention is further directed to a process for growing a p-type zinc oxide film on a substrate. The substrate is first cleaned to ensure that the film will have a reduced number of defects and will properly adhere to the substrate. After cleaning the substrate, the temperature in the chamber is adjusted to between about 300° C. and about 450° C., and a p-type zinc oxide film is grown on the substrate by directing an excimer pulsed laser beam onto a pressed ZnO powder pellet containing a p-type dopant to grow a p-type zinc oxide film containing a net acceptor concentration of at least about $10^{18}$ acceptors/$cm^3$.

The invention is further directed to a process for preparing a p-n junction having a p-type ZnO film and an n-type film wherein the net acceptor concentration is at least about $10^{18}$ acceptors/cm$^{-3}$. A substrate is loaded into a pulsed laser deposition chamber and cleaned to ensure that the film will have a reduced number of defects and will properly adhere to the substrate. The temperature in the deposition chamber is then raised to between about 300° C. and about 450° C. Subsequently a p-type ZnO film having a net acceptor concentration of at least about 10$^{18}$ acceptors/cm$^3$ is grown on the substrate by directing an excimer laser onto a pressed ZnO powder pellet containing the p-type dopant. Finally an n-type film is grown on top of the p-type film by directing an excimer laser beam onto a pressed ZnO pellet containing the n-type dopant.

The invention is further directed to a process for preparing a p-n junction having a p-type ZnO film and an n-type film wherein the net acceptor concentration is at least about 10$^{18}$ acceptors/cm$^{-3}$. A substrate is loaded into a pulsed laser deposition chamber and cleaned to ensure that the film will have a reduced number of defects and will properly adhere to the substrate. The temperature in the deposition chamber is then raised to between about 300° C. and about 450° C. Subsequently an n-type film is grown on the substrate by directing an excimer pulsed laser beam onto a pressed powder pellet containing an n-type dopant element. Finally, a p-type ZnO film is grown on the n-type film by directing an excimer pulsed laser beam onto a pressed ZnO powder pellet containing a p-type dopant element to a p-type ZnO film having a net acceptor concentration of at least about 10$^{18}$ acceptors/cm$^3$.

The invention is further directed to a process for cleaning a substrate prior to growing a film on the substrate. A substrate is loaded into a chamber, the temperature is adjusted to between about 400° C. and about 500° C., and the chamber is filed with hydrogen to create a pressure between about 0.5 and about 3 Torr. The distance between a metal shutter in the chamber and the substrate is adjusted to between about 3 and about 6 centimeters and an excimer pulsed laser having an intensity between about 20 and about 70 mJ and a repetition of between about 10 to about 30 Hz is directed onto the shutter for a period of between about 5 and about 30 minutes to clean the substrate.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that ZnO films containing high levels of p-type dopants can be grown on substrates utilizing a pulsed laser deposition process alone or in combination with an annealing step. Surprisingly, the p-type dopant level achieved in the ZnO film is sufficient to allow the p-type film to be used to form p-n junctions useful in electrical and electroluminescent devices, for use as a substrate material for lattice matching to materials in such devices, and for use as a desirable layer for attaching electrical leads.

Figure 1:
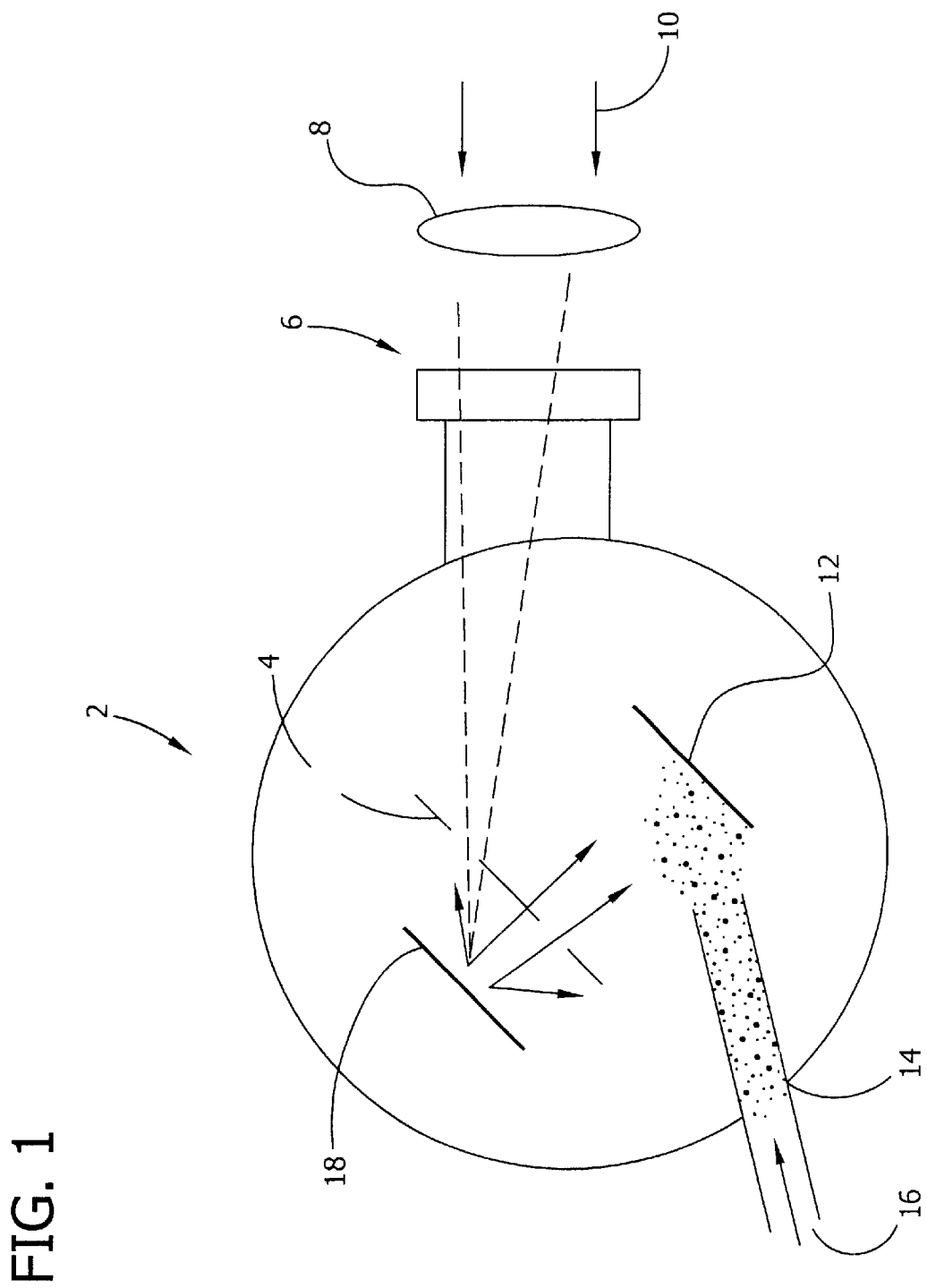
FIG. 1 is a schematic diagram of a pulsed laser deposition system.

Referring now to FIG. 1, there is shown a schematic diagram of a pulsed laser deposition system. Such a system is one method that can be utilized to grow ZnO films containing p-type dopants on suitable substrates. Other methods of growing ZnO films containing p-type dopants on substrates may include molecular beam epitaxy (MBE), MBE in conjunction with laser ablation, and chemical vapor deposition (CVD). Suitable p-type dopants for use in the present invention include Group 1 (also know as IA, which includes elements such as Li, Na, K, Rb, and Ca), Group 11 (also known as IB, which includes elements such as Cu, Ag, and Au), Group 5 (also known as VB, which includes elements such as V, Nb, and Ta), and Group 15 (also known as VA, which includes elements such as N, P, Sb, and Bi), with arsenic being preferred.

Again referring to FIG. 1, there is shown a focusing lens 8 capable of directing an excimer laser beam 10 through laser window 6 into pulsed laser deposition chamber 2. The beam 10 can be directed onto either metal shutter 4 or target 18 depending upon the desired processing step. The beam 10 impinges on either metal shutter 4 or produces an ablation plume of ZnO material from the target 18 and onto substrate 12. During the process of growing ZnO films, gas inlet tube 14 allows gas 16 into the chamber 2.

Before growth of the ZnO film on the substrate, the substrate should be cleaned in order to remove surface contaminants such as oxygen and carbon to minimize the number of defects in the film and to ensure maximum adherence of the film to the substrate. Conventional substrate cleaning techniques including wet chemical treatments, thermal cleaning, hydrogen atom plasma treatments, or any combination thereof can be used to sufficiently clean the substrate surface. In addition, a pulsed excimer laser, such as a pulsed argon fluoride excimer laser, can be used to clean the substrate in situ.

To clean the substrate using a pulsed excimer laser, the temperature in the pulsed laser deposition chamber 2 is first adjusted to between about 400° C. and about 500° C., preferably to about 450° C., and the chamber 2 is filled with a gas such as hydrogen to create a pressure of between about 0.5 and about 3 Torr, preferably between about 1 to about 2 Torr. Referring again to FIG. 1, a metal shutter 4, which may be made from iron, for example, is inserted between the target 18 and the substrate 12 such that the substrate is positioned between about 3 and about 6 centimeters, preferably about 4 centimeters, in front of the metal shutter 4. The focusing lens 8 is removed from the system, and an excimer laser beam 10, such as an argon fluoride excimer laser beam having an intensity of between about 20 and about 70 mJ, preferably about 50 mJ and a repetition rate of about 10 to about 30 Hz, preferably about 20 Hz, is directed into the chamber 2 and onto the metal shutter 4 for a period of between about 5 and about 30 minutes.

Figure 4:
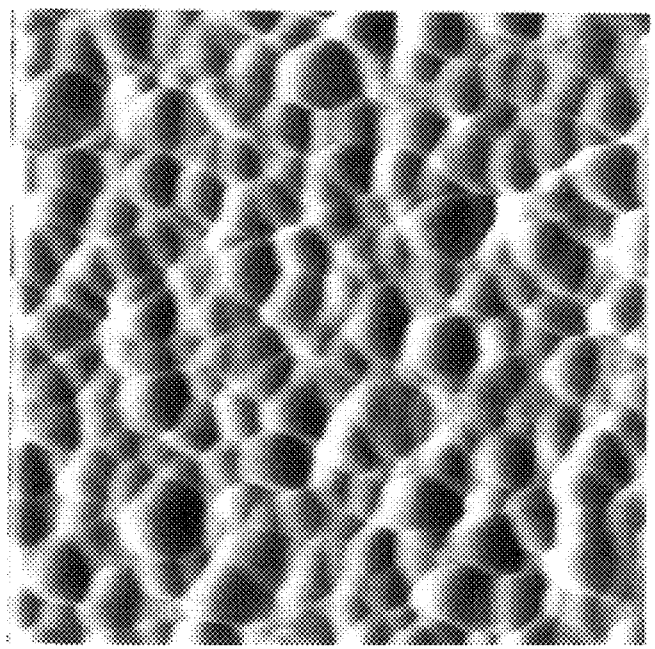
FIG. 4 is an Atomic Force Microscopy image of a ZnSe film on a GaAs substrate wherein the substrate was cleaned using the cleaning process of the present invention.
Figure 5:
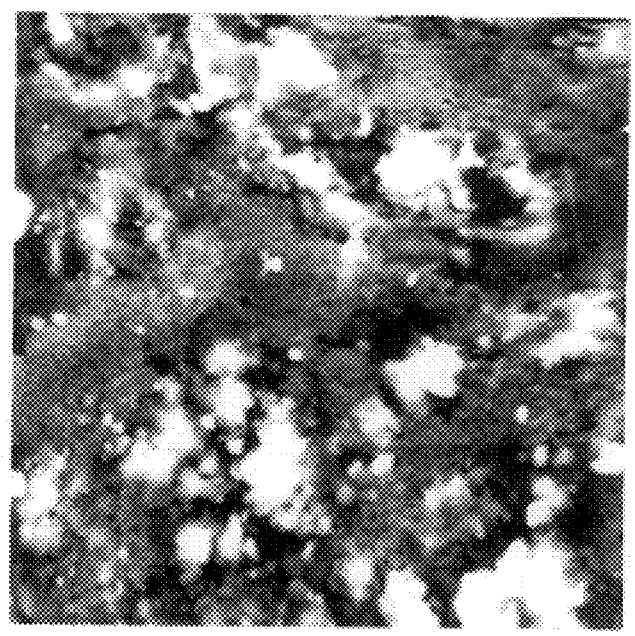
FIG. 5 is an Atomic Force Microscopy image of a ZnSe film on a GaAs substrate wherein the substrate was cleaned using a thermal process.

During this period of illumination of the metal shutter, the laser beam interacts with the metal shutter and creates excited hydrogen atoms, photoelectrons, and photons that effectively remove contaminants from the substrate surface. Using the pulsed excimer laser, the substrate surface can be effectively cleaned at a much lower temperature than that required by conventional techniques. The pulsed excimer laser cleaning process can be effectively utilized to clean GaAs, GaN, sapphire, and other substrates prior to the deposition of ZnO, ZnSe, GaN and other films. For example, FIGS. 4 and 5 show Atomic Force Microscopy (AFM) images of the surface morphology of a ZnSe film on GaAs substrates. In FIG. 4, the GaAs substrate was cleaned prior to the deposition of the ZnSe film using the cleaning process described above and has only a root mean surface roughness of about 1.05 nanometers. In FIG. 5, the GaAs substrate was cleaned prior to the deposition of the ZnSe film by a thermal treatment process at a substrate temperature of about 570° C. and has a root mean surface roughness of about 6.65 nanometers. As indicated in FIGS. 4 and 5, the cleaning process of the present invention leaves a much improved uniform surface for subsequent film growth which greatly improves adherence of the film.

After the period of illumination is complete, the hydrogen gas is pumped out of chamber 2, and the chamber 2 temperature is adjusted to between about 250° C. and about 500° C., preferably to between about 300° C. and about 450° C., to grow the ZnO film.

After the substrate has been cleaned and the temperature in the chamber adjusted, the focusing lens 8 is replaced, the metal shutter 4 is removed and the target is pre-ablated with a pulsed excimer laser having an intensity of between about 20 and about 70 mJ, preferably about 50 mJ, and a repetition rate of between about 10 and about 30 Hz, preferably about 20 Hz for a period of about 10 minutes.

After the pre-ablation is complete, the chamber 2 is filled with oxygen to a pressure of between about 20 and about 40 mTorr, preferably about 35 mTorr. The laser beam 10 is directed through focusing lens 8 and laser window 6 onto the target 18 to produce an ablation plume of ZnO material that is adsorbed onto substrate 12. The target 18 is between about 5 and about 10 centimeters, preferably about 7 centimeters from the substrate 12. Suitable targets for use in the present invention include polycrystalline ZnO and ZnO powder pellets containing a dopant. Suitable substrates for use in the present invention include gallium arsenide, sapphire, and ZnO. The laser beam 10 can have an intensity of about 90 mJ and a repetition of about 20 Hz, for example. The laser beam 10 is directed at the target 18 for a period of about 0.5 to about 4 hours, preferably about 1 to about 2 hours to grow a ZnO film on substrate 12 between about 0.5 and about 3 micrometers thick.

In a particularly preferred embodiment of the present invention, the target 18 is polycrystalline ZnO, the substrate 12 is gallium arsenide, and the p-type dopant is arsenic. If the growth of the ZnO film on the gallium arsenide substrate as described above occurred at a temperature of at least about 400° C., no further processing steps are necessary, and the ZnO layer will contain a net acceptor concentration of at least about $10^{15}$ acceptors/cm$^3$, preferably between about $10^{18}$ and about $10^{21}$ acceptors/cm$^3$ as arsenic atoms will migrate from the gallium arsenide substrate into the ZnO film during the film growth at a temperature of at least about 400° C. Additionally, the film will have a resistivity of no more than about 1 ohm-cm, preferably between about 1 and about $10^{-4}$ ohm-cm, and a Hall mobility of between about 0.1 and about 50 cm$^2$/Vs.

If the growth of the ZnO film on the gallium arsenide substrate occurs below about 400° C., a further processing step (annealing) is required to diffuse arsenic from the substrate into the ZnO film. This annealing step consists of adjusting the temperature in the chamber 2 to between about 450° C. and about 600° C., preferably to about 500° C., and filling the chamber 2 with a gas such as nitrogen or oxygen at a pressure between about 0.5 and about 4 Torr, preferably about 1 to about 2 Torr. The gallium arsenide substrate is annealed for a period of between about 10 and about 60 minutes, preferably about 20 to about 30 minutes to produce a net acceptor concentration of at least about $10^{15}$ acceptors/cm$^3$, preferably between about $10^{18}$ acceptors/cm$^3$ and about $10^{21}$ acceptors/cm$^3$ from the substrate 12 into the ZnO film.

Without being bound to a particular theory, in the one preferred embodiment when arsenic dopant from a GaAs substrate is caused to diffuse into a ZnO film, superior results are achieved due in substantial part to the fact that the p-type dopant elemental source is the substrate itself. The p-type dopant elemental source is therefore in intimate contact with the film, which facilitates diffusion more efficiently and to a greater degree as compared to processes in which the substrate is not the dopant source. In this particular embodiment, therefore, having the dopant source be the substrate facilitates achieving the improvements in net acceptor concentration, resistivity, and Hall mobility described herein. Also, the cleaning process as described herein utilized with the preferred film growing and annealing processes cleans the GaAs surface extremely well to remove contaminants such as carbon and oxygen without damaging the crystal structure. The clean, non-damaged surface allows the ZnO film to grow with improved crystal alignment and with a reduced number of defects. This cleaning process therefore further facilitates diffusion of arsenic more efficiently and to a greater degree, which results in improvements in structural, optical and electrical properties.

Alternatively, ZnO films containing p-type dopants such as arsenic on a substrate can be prepared using pressed ZnO powder pellets containing a p-type dopant as the target in the pulsed laser deposition chamber. This process does not require migration of the dopant from the substrate into the film, and hence no annealing step is required.

A ZnO film is grown on a suitable substrate using the pulsed laser deposition method described above except that the target is a pressed ZnO powder pellet that contains a small amount of elemental p-type dopant. The amount of dopant, such as arsenic, required in the powder pellet to achieve a net acceptor concentration level of at least about $10^{15}$ acceptors/cm$^3$, preferably between about $10^{18}$ acceptors/cm$^3$ and about $10^{21}$ acceptors/cm$^3$ is determined by measuring the amount of dopant in the ZnO film and adjusting the dopant level in the powdered pellet until the net acceptor concentration of at least about $10^{15}$ acceptors/cm$^3$, preferably between about $10^{18}$ acceptors/cm$^3$ and about $10^{21}$ acceptors/cm$^3$ is reached. For example, secondary ion mass spectroscopy (SIMS) can be used to determine the amount of dopant in the ZnO film. Additionally, Hall measurements in combination with electrical resistivity measurements can be used to determine whether the ZnO film is p-type or n-type, the net concentration of p-type or n-type carriers in the ZnO film, to determine the Hall mobility of the carriers, and to determine the electrical resistivity of the ZnO film. One skilled in the art will realize that the amount of dopant required in the powdered pellet may depend on numerous factors including operating conditions, distances from the target to the substrate, the size and shape of the chamber, as well as other variables during growth.

The concentration of p-type dopant may be varied within the p-type film by using more than one target and by selecting the target source during growth that yields the desired acceptor concentrations in the ZnO film. Such variations may be desirable in order to prepare surfaces onto which electrical leads may be attached that have desirable electrical properties.

Also in accordance with the present invention homoepitaxial and heteroepitaxial p-n junctions containing p-type doped ZnO films may be produced on suitable substrates such as gallium arsenide, sapphire and ZnO. To produce a homoepitaxial p-n junction, a ZnO layer is first grown on the substrate utilizing a pressed ZnO powder pellet containing a p-type dopant such as arsenic as described above to obtain a net acceptor concentration of at least about $10^{15}$ acceptors/$cm^3$, preferably between about $10^{18}$ acceptors/$cm^3$ and about $10^{21}$ acceptors/$cm^3$. The concentration of p-type dopant may be varied across the p-type film by using more than one target and by selecting the target source during growth that yields the desired acceptor carrier concentration in the ZnO film. Such variations may be desirable in order to prepare surfaces onto which electrical leads may be attached that have desirable electrical properties.

To complete the homoepitaxial p-n junction, an n-type ZnO film is grown on top of the p-type ZnO film on top of the substrate. The n-type ZnO film is grown on top of the p-type ZnO film utilizing a pressed ZnO powder pellet containing an n-type dopant such as aluminum as described above to yield an n-type film having a net donor concentration of at least about $10^{15}$ donors/$cm^3$, preferably between about $10^{18}$ donors/$cm^3$ and about $10^{21}$ donors/$cm^3$. As with the p-type film, the concentration level of the n-type carriers may be varied across the film by employing more than one target.

A heteroepitaxial p-n junction can also be produced in accordance with the present invention. To prepare a heteroepitaxial p-n junction, a p-type ZnO film is grown on a suitable substrate as described above and a film containing an n-type dopant is grown on top of the p-type ZnO film. The n-type film, however, is not comprised of ZnO in a heteroepitaxial p-n junction wherein a p-type ZnO film is utilized. Another source such as zinc selenide is used to produce the n-type film.

The use of heteroepitaxial structure p-n junctions prepared in accordance with the present invention provides additional materials for p-n junction and device fabrication so as to achieve an expanded range of bandgap energies, increased optical tuning ranges, increased device lifetimes, more desirable processing parameters and conditions, as well as other advantages that will be recognized by one skilled in the art.

It will be recognized by one skilled in the art that, similar to the preparing of ZnO films on a substrate, the preparation of homoepitaxial and heteroepitaxial p-n junctions can be accomplished using additional techniques in place of pulsed laser deposition. Other techniques include MBE, MBE with laser ablation, CVD, and MOCVD. It will also be recognized that devices having a more complex structure such as n-p-n junctions, p-n-p junctions, FETs, photodetectors, lattice matching layers, and layers on which electrical leads may be attached can easily be fabricated using the above-described techniques and processes.

In accordance with the present invention, p-type ZnO material may be used as substrate material to reduce or eliminate problems associated with lattice mismatch. P-type ZnO material that has a sufficiently high net acceptor concentration and low electrical resistivity can be used for forming electrical contacts with desirable properties on devices. For example, a template p-type ZnO layer can be synthesized on two-compound semiconductor substrates such as GaAs. This template would provide a transition layer for growing epitaxial GaN-based materials with a density of defects that is lower than would occur in GaN films grown directly on GaAs.

The present invention is illustrated by the following example which is merely for the purpose of illustration and is not to be regarded as limiting the scope of the invention or manner in which it may be practiced.

EXAMPLE

In this example a ZnO film was synthesized on a gallium arsenide substrate and the film/substrate was annealed to diffuse p-type arsenic dopant from the substrate into the film to produce a p-type ZnO film on a gallium arsenide substrate.

A gallium arsenide substrate having the shape of a thin wafer and being about 1 centimeter by about 1 centimeter by about 0.05 centimeters was loaded into a pulsed laser deposition chamber, the temperature set at 450° C., and the chamber filled with high purity hydrogen to a pressure of about 2 Torr. An iron shutter was inserted in front of the gallium arsenide substrate to create a separation distance of 4 centimeters between the substrate and the shutter. An argon fluoride excimer pulsed laser beam having an intensity of 50 mJ and a repetition rate of 20 Hz was directed at the metal shutter through a laser window and the shutter was illuminated for about 20 minutes to clean the substrate. Subsequently, the hydrogen was pumped out of the chamber, and the substrate temperature was decreased to about 300° C.

After the substrate was cleaned, the metal shutter was removed and a focusing lens was inserted in front of the laser window to focus the laser beam. The polycrystalline ZnO target was pre-ablated with the excimer pulsed laser beam which was operating at an intensity of about 50 mJ and having a repetition of about 20 Hz for a period of about 10 minutes. High purity oxygen gas was then introduced into the chamber to create a pressure of about 35 mTorr.

The excimer pulsed laser beam, operating at an intensity of about 90 mJ and a repetition of about 20 Hz, was then directed at the polycrystalline ZnO for a period of about 2 hours to grow a ZnO film having a thickness of about 1.0 micrometers on the substrate.

After the film growth, the pressure in the chamber was adjusted to about 2 Torr, and the temperature increased to about 500° C. The film/substrate was annealed for about 30 minutes to diffuse arsenic atoms from the substrate into the ZnO film. The annealing created an arsenic doped p-type ZnO film on the gallium arsenide substrate.

Figure 2:
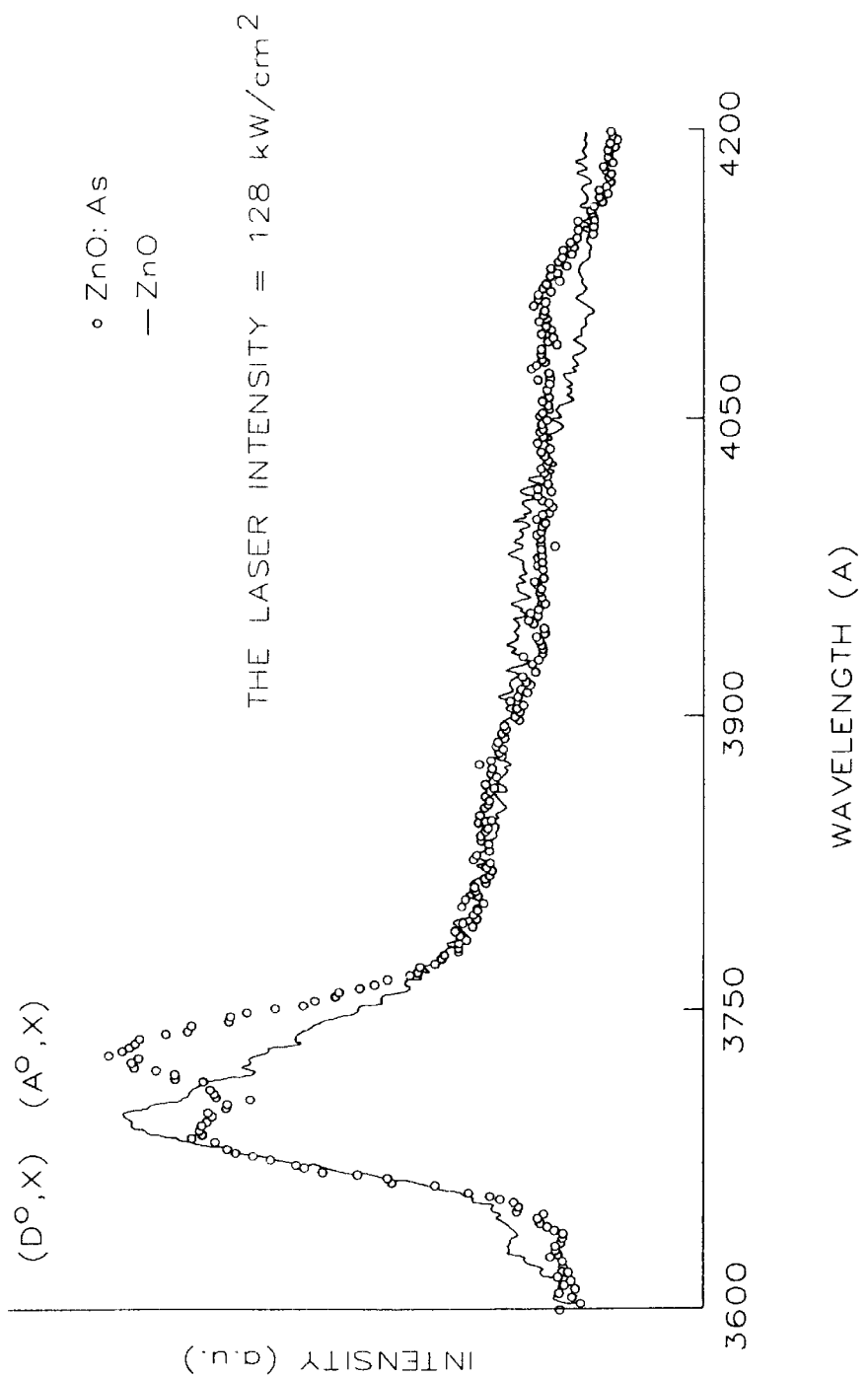
FIG. 2 is a photoluminescence spectra at 20° K of a ZnO film and an arsenic-doped ZnO film prepared in accordance with the present invention.

FIG. 2 shows a photoluminescence spectra at 20° K of the ZnO film (solid line) and the arsenic-doped ZnO film (dots) prepared in this Example. The pumping excitation is from a pulsed nitrogen laser with a power density of 128 kW/$cm^2$. The spectra shows that for the ZnO film the donor-bound excitonic peaks located at about 3.36 eV (3698 angstroms) are dominant. However, the arsenic doped ZnO film of the present example shows that the acceptor-bound excitonic peak located at about 3.32 eV (3742 angstroms) is the strongest peak. This feature of acceptor-bound excitonic peaks indicates that the acceptor density is greatly increased with arsenic doping, and the ZnO film becomes p-type.

Figure 3:
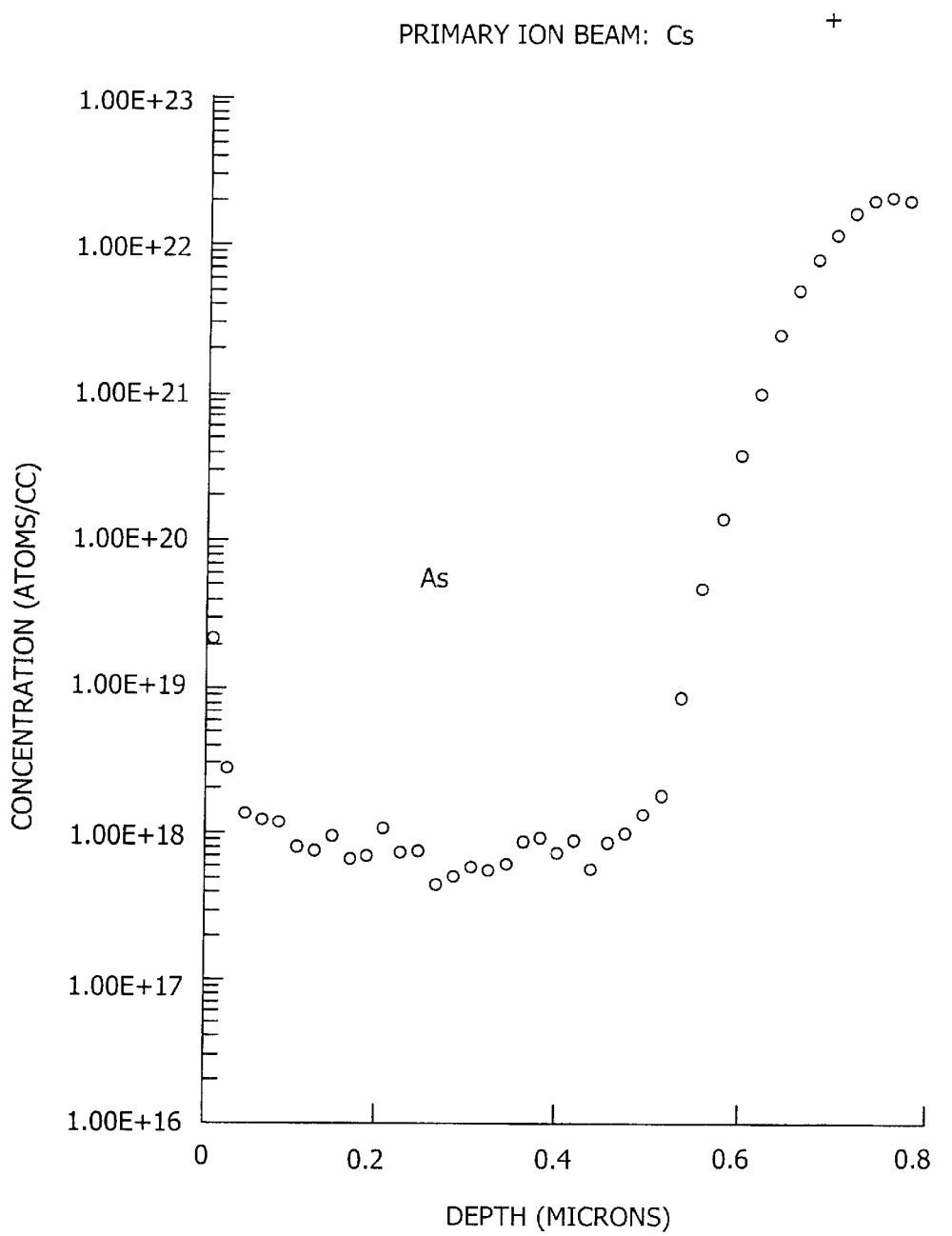
FIG. 3 is a Secondary Ion Mass Spectroscopy (SIMS) plot of an arsenic doped ZnO film prepared in accordance with the present invention.

FIG. 3 shows a Secondary Ion Mass Spectroscopy (SIMS) plot of the arsenic doped ZnO film prepared in this Example. The plot shows the concentration in atoms/$cm^3$ of arsenic as a function of depth from the surface of the arsenic doped ZnO film. This plot shows that the arsenic concentration is about $10^{18}$ atoms/cm$^3$ to about $10^{21}$ atoms/cm$^3$ throughout the film.

In view of the above, it will be seen that the several objects of the invention are achieved.

As various changes could be made in the above-described process for preparing p-type ZnO films without departing from the scope of the invention, it is intended that all matter contained in the above description be interpreted as illustrative and not in a limiting sense.

What is claimed is:

1. A process for growing an arsenic doped ZnO film on a GaAs substrate in a pulsed laser deposition chamber, the process comprising:
    cleaning the GaAs substrate;
    adjusting the temperature in the pulsed laser deposition chamber to between about 300° C. to about 450° C.;
    pre-ablating a polycrystalline ZnO crystal;
    directing an excimer pulsed laser beam onto the polycrystalline ZnO crystal to grow a ZnO film on the GaAs substrate;
    increasing the temperature of the pulsed laser deposition chamber to between about 450° C. and about 600° C.; and
    annealing the ZnO coated GaAs substrate to diffuse at least about $1 \times 10^{18}$ acceptors/cm$^3$ from the GaAs into the ZnO film to produce the arsenic doped ZnO film.

2. The process as set forth in claim 1 wherein the ZnO film has a thickness of between about 0.5 and about 3 micrometers.

3. The process as set forth in claim 1 wherein the arsenic doped ZnO film has a net acceptor concentration of between about $1 \times 10^{18}$ acceptors/cm$^3$ and about $1 \times 10^{21}$ acceptors/cm$^3$, a resistivity of between about 1 and about $1 \times 10^{-4}$ ohm-cm, and a Hall Mobility of between about 0.1 and about 50 cm$^2$/Vs.

4. The process as set forth in claim 1 wherein the substrate is cleaned in the pulsed laser deposition chamber using a pulsed excimer laser.

5. A process for growing a p-type ZnO film on a substrate, the process comprising:
    cleaning the substrate;
    adjusting the temperature in the pulsed laser deposition chamber to between about 300° C. and about 450° C.; and
    growing a p-type ZnO film on the substrate by directing an excimer pulsed laser beam onto a pressed ZnO powder pellet containing a p-type dopant to grow the p-type ZnO film containing at least about $10^{18}$ acceptors/cm$^3$ on the substrate.

6. The process as set forth in claim 5 wherein the p-type ZnO film has a thickness of between about 0.5 and about 3 micrometers.

7. The process as set forth in claim 5 wherein the p-type dopant is selected from group 1, 11, 5, and 15 elements.

8. The process as set forth in claim 5 wherein the p-type ZnO film has a net acceptor concentrate of between about $10^{18}$ acceptors/cm$^3$ and about $10^{21}$ acceptors/cm$^3$, a resistivity no greater than about 1 ohm-cm, and a Hall Mobility of between about 0.1 and about 50 cm$^2$/Vs.

9. The process as set forth in claim 5 wherein the p-type dopant is arsenic.

10. The process as set forth in claim 5 wherein the substrate is cleaned in the pulsed laser deposition chamber using a pulsed excimer laser.

11. A process for preparing a p-n junction having a p-type ZnO film and an n-type film wherein the net acceptor concentration is at least about $10^{18}$ acceptors/cm$^3$, the process comprising:
    cleaning a substrate;
    adjusting the temperature in the pulsed laser deposition chamber to between about 300° C. to about 450° C.;
    growing a p-type ZnO film on the substrate by directing an excimer pulsed laser beam onto a pressed ZnO powder pellet containing a p-type dopant element to grow a p-type ZnO film containing at least about $10^{18}$ acceptors/cm$^3$ on the substrate; and
    growing an n-type film on top of the p-type ZnO film by directing an excimer pulsed laser beam onto a pressed powder pellet containing an n-type dopant element to grow an n-type film on the p-type ZnO film on the substrate.

12. The process as set forth in claim 11 wherein the n-type film has a thickness of between about 0.5 and about 3 micrometers and the p-type film has a thickness of between about 0.5 and about 3 micrometers.

13. The process as set forth in claim 11 wherein the p-type dopant element is arsenic and the n-type dopant element is aluminum.

14. The process as set forth in claim 11 wherein the p-n junction is a homoepitaxial p-n junction wherein the p-type film consists of arsenic and ZnO and the n-type film consists of an n-type dopant element and ZnO.

15. The process as set forth in claim 11 wherein the p-n junction is a heteroepitaxial p-n junction wherein the p-type film consists of arsenic and ZnO and the n-type film contains an n-type dopant and has an energy bandgap different than ZnO.

16. The process as set forth in claim 11 wherein the substrate is cleaned in the pulsed laser deposition chamber using a pulsed excimer laser.

17. A process for preparing a p-n junction having a p-type ZnO film and an n-type film wherein the net acceptor concentration is at least about $10^{18}$ acceptors/cm$^3$, the process comprising:
    cleaning a substrate;
    adjusting the temperature in the pulsed laser deposition chamber to between about 300° C. to about 450° C.;
    growing an n-type film on top of the substrate by directing an excimer pulsed laser beam onto a pressed powder pellet containing an n-type dopant element to grow an n-type film on the substrate;
    growing a p-type ZnO film on the n-type film by directing an excimer pulsed laser beam onto a pressed ZnO powder pellet containing a p-type dopant element to grow a p-type ZnO film containing at least about $10^{18}$ acceptors/cm$^3$ on the n-type film.

18. The process as set forth in claim 17 wherein the n-type film has a thickness of between about 0.5 and about 3 micrometers and the p-type film has a thickness of between about 0.5 and about 3 micrometers.

19. The process as set forth in claim 17 wherein the p-type dopant element is arsenic and the n-type dopant element is aluminum.

20. The process as set forth in claim 17 wherein the p-n junction is a homoepitaxial p-n junction wherein the p-type film consists of arsenic and ZnO and the n-type film consists of an n-type dopant element and ZnO.

21. The process as set forth in claim 17 wherein the p-n junction is a heteroepitaxial p-n junction wherein the p-type film consists of arsenic and ZnO and the n-type film contains an n-type dopant and has an energy bandgap different than ZnO.

22. The process as set forth in claim 17 wherein the substrate is cleaned in the pulsed laser deposition chamber using a pulsed excimer laser.

23. A process for cleaning a substrate in a chamber prior to growing a film on the substrate, the process comprising:

loading the substrate into the chamber and adjusting the temperature in the chamber to between about 400° C. and about 500° C.;

filling the chamber with hydrogen to create a pressure in the chamber of between about 0.5 and about 3 Torr;

adjusting the distance between a metal shutter in the chamber and the substrate to between about 3 to about 6 centimeters; and directing an excimer pulsed laser beam having an intensity of between about 20 to about 70 mJ and a repetition of between about 10 to about 30 Hz into the chamber for a period of between about 5 and about 30 minutes to illuminate the metal shutter and clean the substrate.

24. The process as set forth in claim 23 wherein the chamber temperature is about 450° C., the metal shutter is about 4 centimeters from the substrate, and an argon fluoride pulsed excimer laser having an intensity of about 50 mJ and a repetition of about 20 Hz illuminates the shutter for about 20 minutes to clean the substrate.

* * * * *